United States Patent
Peale et al.

(10) Patent No.: US 9,819,150 B2
(45) Date of Patent: Nov. 14, 2017

(54) SURFACE-EMITTING RING-CAVITY QUANTUM CASCADE LASER WITH RING-SHAPED PHASE SHIFTER AND RELATED METHODS

(71) Applicant: UNIVERSITY OF CENTRAL FLORIDA RESEARCH FOUNDATION, INC., Orlando, FL (US)

(72) Inventors: Robert E. Peale, Winter Park, FL (US); Pedro Figueiredo, Orlando, FL (US); Andrey V. Muraviev, Orlando, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 915 days.

(21) Appl. No.: 14/295,941

(22) Filed: Jun. 4, 2014

(65) Prior Publication Data
US 2017/0214217 A1    Jul. 27, 2017

Related U.S. Application Data

(60) Provisional application No. 61/831,268, filed on Jun. 5, 2013.

(51) Int. Cl.
| | | |
|---|---|---|
| *G02B 6/12* | (2006.01) | |
| *H01S 5/10* | (2006.01) | |
| *H01S 5/18* | (2006.01) | |
| *H01S 5/34* | (2006.01) | |
| *H01S 5/068* | (2006.01) | |
| *H01S 5/024* | (2006.01) | |

(52) U.S. Cl.
CPC ............. *H01S 5/1071* (2013.01); *H01S 5/024* (2013.01); *H01S 5/06821* (2013.01); *H01S 5/18* (2013.01); *H01S 5/3401* (2013.01)

(58) Field of Classification Search
CPC ........ H01S 5/024; H01S 5/06821; H01S 5/18; H01S 5/3401
USPC ......................................... 372/92, 29.023, 99
See application file for complete search history.

(56) References Cited

U.S. PATENT DOCUMENTS

| | | | |
|---|---|---|---|
| 7,231,122 B2 * | 6/2007 | Weisberg ........... | G02B 6/02304 359/487.04 |
| 7,535,656 B2 | 5/2009 | Day et al. | |
| 8,328,396 B2 * | 12/2012 | Capasso ................. | B82Y 20/00 359/641 |
| 8,723,145 B2 | 5/2014 | Capasso et al. | |

(Continued)

OTHER PUBLICATIONS

Lee et al., "Modal Characteristics of Arrow-Type Vertical-Cavity Surface-Emitting Lasers," IEEE Photonics Technology Letters, vol. 13, No. 8, Aug. 2001, pp. 770-772.

(Continued)

*Primary Examiner* — Tuan Nguyen
(74) *Attorney, Agent, or Firm* — Allen, Dyer, Doppelt & Gilchrist, P.A.

(57) ABSTRACT

A ring-cavity surface emitting quantum cascade laser (RCSE-QCL) may include a ring-shaped active region having first and second opposing facets. One of the first and second opposing facets may define a radiation emitting facet. The RCSE-QCL may also include a ring-shaped phase shifter aligned with the radiation emitting facet and having a spiraled surface.

24 Claims, 8 Drawing Sheets

(56) References Cited

U.S. PATENT DOCUMENTS

2013/0077648 A1 3/2013 Felder et al.
2013/0221223 A1 8/2013 Caneau et al.

OTHER PUBLICATIONS

Sun et al., "Surface-Emitting Circular DFB, Disk-, and Ring-Bragg Resonator Lasers with Chirped Gratings: A Unified Theory and Comparative Study," Optics Express, vol. 16, No. 12, Jun. 9, 2008, pp. 9155-9167.
Mujagic et al., "Ring Cavity Induced Threshold Reduction in Single-Mode Surface Emitting Quantum Cascade Lasers," Applied Physics Letters, 96, 2010, pp. 031111-1-031111-3.
Sulkin et al., "Structured Nanoaperture Vertical Cavity Surface-Emitting Lasers," IEEE Journal of Selected Topics in Quantum Electronics, vol. 19, No. 3, May/Jun. 2013, 4 pages.

* cited by examiner

SURFACE-EMITTING RING-CAVITY QUANTUM CASCADE LASER WITH RING-SHAPED PHASE SHIFTER AND RELATED METHODS

RELATED APPLICATIONS

This application is based upon prior filed copending provisional patent application Ser. No. 61/831,268 filed Jun. 5, 2013, the entire subject matter of which is incorporated herein by reference in its entirety.

TECHNICAL FIELD

This invention relates to lasers and, in particular, to quantum cascade laser and related methods.

BACKGROUND

Quantum cascade lasers (QCLs) differ from traditional semiconductor diode lasers in that they do not use a p-n junction for light emission. Multiple active regions are "cascaded" so that each injected electron can emit multiple photons and therefore enhance laser gain. Each active region includes a multi-layered semiconductor material structure. This multi-layered semiconductor material structure is designed to have an electronic band structure that gives the desired emission wavelength, and is manufactured with nanometer-level thickness control.

Most commercially available QCLs are of the "edge-emitting" variety. In these, linear ridges are created by etching vertically through the layered structure, which has been grown on a wafer substrate. These are cleaved so that the active region comprises a rectangular ridge of several mm length, which forms a waveguide. The laser radiation is amplified by passing back and forth along the axis of the ridge. Laser emission occurs on the end facets of these ridges.

A current topic of research is ring-cavity surface-emitting (RCSE) QCLs. Here, the etched ridges are in the form of circles. The circular ridge forms a waveguide, inside which the laser radiation is amplified by going around and around. Emission occurs perpendicular to the plane of the ring, along the ring's symmetry axis, and perpendicular to the surface of the substrate. Emission occurs through the top of the ring and/or via the bottom and through the bottom side of the substrate. A feature of RCSE-QCLs is that the spatial distribution of their emission is in the form of a ring, or concentric rings, typically with a node (absence of radiation) at the center of the ring. While RCSE-QCLs have certain advantages over edge emitting QCLs, the central node in their beam profile may be a disadvantage for applications.

SUMMARY

In view of the foregoing background, it is therefore an object of the present disclosure to provide a RCSE-QCL that has a peak of intensity at the center of its spatial emission profile, i.e. one where the maximum intensity lies on the symmetry axis of the ring waveguide.

This and other objects, features, and advantages in accordance with the present disclosure are provided by a RCSE-QCL that may comprise a ring-shaped active region having first and second opposing facets, at least one of the first and second opposing facets defining a radiation emitting facet, and a ring-shaped phase shifter aligned with the radiation emitting facet and having a spiraled surface. Advantageously, the RCSE-QCL has a more uniform radiation pattern.

In some embodiments, the RCSE-QCL may further comprise a substrate adjacent the ring-shaped active region and being opposite the radiation emitting facet, and the ring-shaped phase shifter may be positioned on the radiation emitting facet of the ring-shaped active region. In other embodiments, the RCSE-QCL may further comprise a substrate adjacent the ring-shaped active region, abutting the radiation emitting facet, and defining the ring-shaped phase shifter.

In particular, the ring-shaped phase shifter may have an optical thickness that varies from a first value to a second value greater than the first value based upon an azimuthal position. The second value may comprise an operational wavelength of the ring-shaped active region. The ring-shaped phase shifter may reduce a central node in a radiation pattern of the ring-shaped active region.

Additionally, the RCSE-QCL may further comprise at least one additional ring-shaped active region nested with the ring-shaped active region, the at least one additional ring-shaped active region and the ring-shaped active region emitting radiation of a same wavelength. The at least one additional ring-shaped active region and the ring-shaped active region may be concentric to produce a radially smooth intensity profile without azimuthal modal modulation. The RCSE-QCL may further comprise a cooling device adjacent the ring-shaped active region.

Another aspect is directed to a method of making a RCSE-QCL. The method may comprise forming a ring-shaped active region having first and second opposing facets, at least one of the first and second opposing facets defining a radiation emitting facet, and forming a ring-shaped phase shifter aligned with the radiation emitting facet and having a spiraled surface.

BRIEF DESCRIPTION OF THE DRAWINGS

FIG. 3b is a diagram of radial far-field intensity distribution for the RCSE-QCL of FIG. 3a.

FIG. 4b is a diagram of radial far-field intensity patterns for the RCSE-QCLs of FIGS. 3a and 4a.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and multiple prime notations are used to indicate similar elements in alternative embodiments.

Figure 1A:
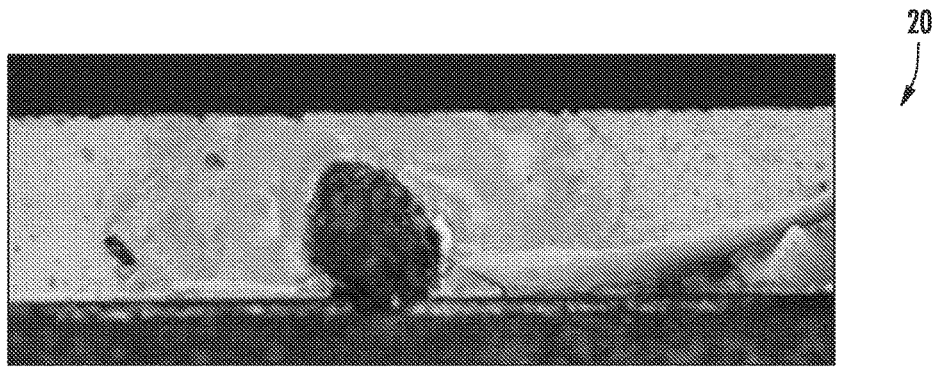
FIG. 1a is an image of a microscope image of the laser-emission facet of an edge-emitting QCL, which has been destroyed by optical breakdown at the anti-reflective (AR) coating on the exit facet.

Referring initially to FIGS. 1a-2b, an image 20 illustrates a problem of edge-emitting infrared QCLs that have high facet optical-power densities, which can damage optical coatings and lead to catastrophic failure. FIG. 1a is an optical microscope image 20 of an edge-emitting QCL destroyed by optical breakdown at the AR coating on the exit facet.

Figure 1B:
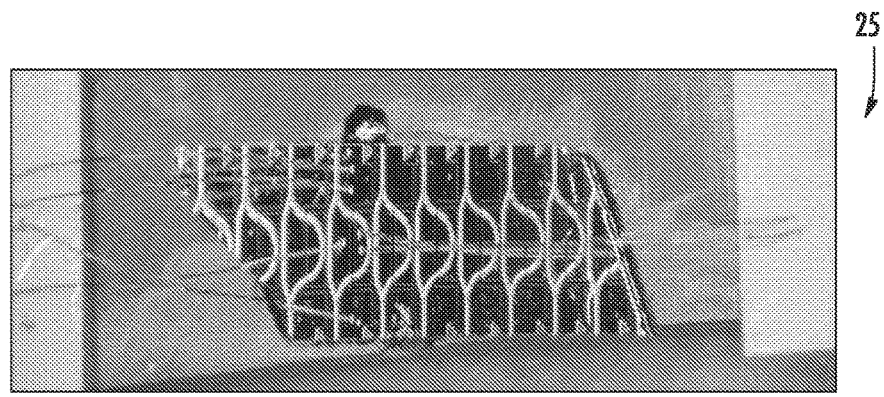
FIG. 1b is an image of a top plan view of an array of experimental edge-emitting ridge-waveguide QCLs wire-bonded on a submount.

A second problem is that edge emitting QCLs cannot be tested without first cleaving the wafer and mounting it on a submount (FIG. 1b). FIG. 1b is a microscope image 25 of an array of experimental edge-emitting QCLs wire-bonded on a submount, which suggests the amount of poorly-repeatable hand-work required to prepare each QCL for tests. While materials costs are currently only ~$100/laser, skilled labor costs increase the per-laser price to ~$5,000, or more if facet coatings are required.

Figure 2A:
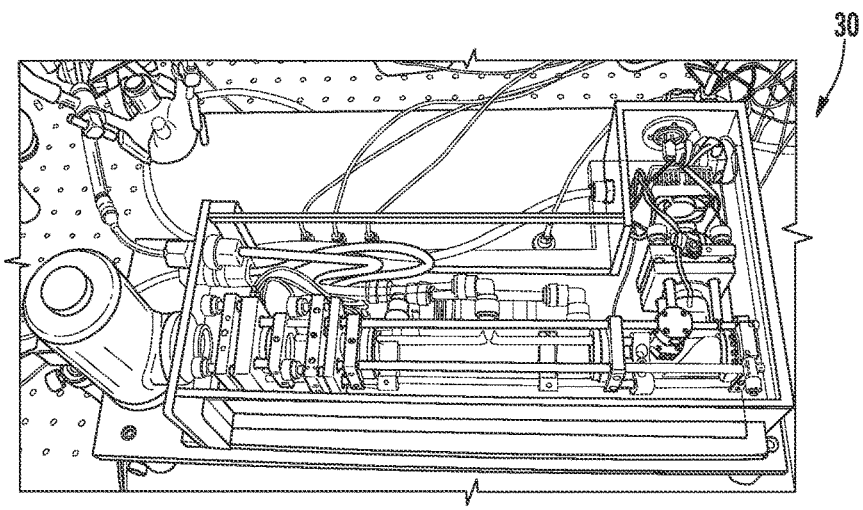
FIG. 2a is an image of a QCL intracavity laser absorption spectrometer, which uses an edge-emitting QCL with rectangular-ridge waveguide.
Figure 2B:
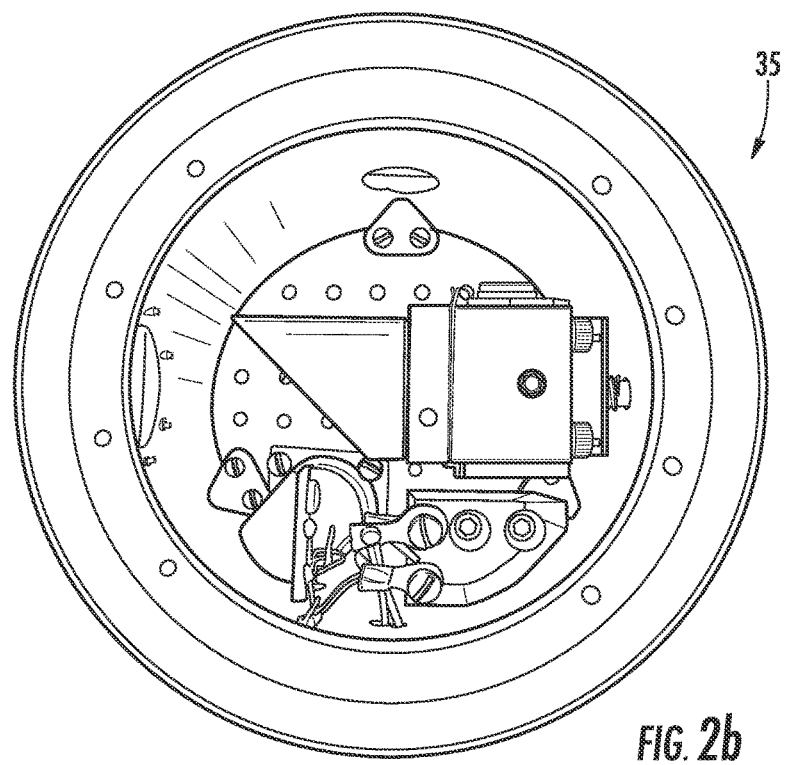
FIG. 2b is an image of a top plan view of an edge-emitting THz QCL inside a liquid nitrogen cryostat with off-axis parabolic mirror to collimating the divergent laser emission.

A third problem is that an edge-emitting QCL's typical 3 micron thick active region causes strongly divergent emission and poor beam qualities due to diffraction at small exit apertures. Complex, bulky, and expensive optical approaches are required to collect and collimate the beam (FIGS. 2a and 2b). FIG. 2a shows an image 30 of a QCL intracavity laser absorption spectrometer. The rectangular-ridge edge-emitting QCL is mounted in the upper left corner. An off-axis paraboloid collects the divergent emission and collimates it toward an external cavity mirror on the right. A collimating lens may be used in place of the paraboloid, but with little benefit in bulk or cost. FIG. 2b shows an image 35 of a THz QCL mounted on a 77 K cold surface within a liquid nitrogen cryostat using an off-axis mirror for collecting and collimating the radiation. With the mirror inside the cryostat, adjustment is difficult. A fourth problem is that, for external cavity operations (FIG. 2a), the small active region makes it difficult to couple the light back in, and the required tight focusing back onto the end facet, which inevitably accumulates contamination, exacerbates the potential for damage (as occurred in FIG. 1a).

The opportunity is based on RCSE-QCLs, which provide large exit apertures with low power densities and stabilized emission wavelengths via second-order distributed feedback (DFB) from surface gratings that double as output couplers. Elimination of cleaving and tricky facet-coatings reduces handwork and manufacturing costs. Full wafer-scale fabrication and on-wafer testing eliminates intensive labor and messy mounting and packaging of individual dies. RCSE-QCLs with single-spatial-mode and 0.5 W single-frequency continuous wave (CW) operation have been demonstrated. Laser cavity Q factor of the ring DFB QCLs is higher than for waveguide ridge QCLs made of identical wafer.

A problem with RCSE-QCLs is that their beams are non-Gaussian, comprising concentric rings with a node at the center. The reason for the far-field radial modulation in the form of concentric rings is diffraction from the relatively narrow circular active ridge and interference of waves from different parts of the ring. The central node occurs because of the azimuthal polarization of the emitted laser radiation, which leads to destructive interference along the symmetry axis of the ring normal to the plane of the ring. Additionally, non-optimum DFB grating periods result in high order modal modulation that worsens the divergence. The opportunities suggested in the present disclosure include nested concentric RCSE-QCLs that smooth the radial far-field modulation, operation in low-order modal modulation, and phase control of the azimuthal field distribution to eliminate the central node.

The present disclosure describes an approach to the design of power-scalable, chip-based, high-power, single aperture RCSE-QCL with outstanding beam quality at infrared wavelengths. RCSE-QCLs generally enable wafer-level fabrication and testing, which reduces piece work and handling to achieve ultra-low manufacturing costs. By employing the disclosure described here, the device will be capable of emitting an output power of over 15 W CW through a single aperture and with an outstanding output beam quality (M2<1.2).

The objective of low-order mode envelope function is achieved by proper choice of DFB grating period and depth.

One aspect is directed to a spiral wedge phase shifter (FIG. 4a) to eliminate the central node in the far-field spatial intensity distribution.

Another aspect is directed to nested concentric ring-cavity QCLs (FIG. 6) with a number, diameter, and the said spiral wedge phase shifter, to smooth the oscillations that appear in the radial intensity profile. Where inherent reflections for substrate-emitting RCSE-QCLs suffice to coherently lock all rings, and where the DFB grating is designed so that each ring emits on the same wavelength without azimuthal modal modulation. Also, coupling ridges may be used between the rings to achieve phase lock operation. Each ring must be properly biased to achieve optimum gain spectrum.

The optical circumference ($n_{eff} 2\pi a$, FIG. 3a) of a RC-QCL contains an integer number s of wavelengths λ due to periodic boundary conditions:

$$s\lambda = (n_{eff} 2\pi a). \qquad (1)$$

The wavevector of the radiation in the RCSE-QCL is:

$$K = n_{eff} 2\pi/\lambda. \quad (2)$$

This wavevector is related to the DFB surface-grating wavevector $$K_0 = 2\pi/\Lambda, \quad (3)$$

and the wavevector of the mode envelop function (MEF)

$$g = 2\pi m/(2\pi a) = m/a, \quad (4)$$

according to $$K = K_0 + g. \quad (5)$$

Here, $\Lambda$ is the grating period and m is the integer order of the MEF. The far-field emission pattern for a RCSE-QCL is in the form of concentric rings. The position of the rings may be determined by the phenomenological expression $$\sin(2\theta) = (n + (m+1)/2)\lambda/a; \quad (6)$$

where polar angle $\theta$ is the half angle of the divergence, and n is the diffraction order ($\geq 0$) and m=0, 1, 2, 3 .... Smaller divergence is favored by smaller m values. An advantageous embodiment achieves operation on the lowest mode, which gives uniform emission intensity from all points on the ring. Then, the far-field pattern is given by $\sin(2\theta) = (n+\frac{1}{2})\lambda/a$. In typical approaches, this achieves the narrowest possible beam from a traditional RCSE-QCL, but it fails to eliminate the central node on the axis of symmetry due to the destructive interference on that axis. Elimination of the central node is achieved using the spiral wedge as discussed below.

The mathematical basis for the spiral phase shifter is presented in paragraph 78 herein. Here we present a qualitative description. For the case m=0, the rays from any pair of opposite source elements in a usual RCSE-QCL combine and interfere destructively on the symmetry axis, as shown in FIG. 3b, to give a node on the symmetry axis.

To achieve operation on the fundamental mode m=0, the grating period is chosen to exactly match the wavelength of the circulating wave inside the ring. Due to relatively narrow active media gain spectrum, without proper design, the dominant mode's wavelength may differ from grating period. Then a periodic series of "hot spots" will appear around the ring located by the spatial "beat frequency" between IR and grating "waves", according to Equation 5, which will increase the divergence and prominence of the central node. This has been shown in experiments in which RCSE-QCLs with different but close grating periods were fabricated. Each different period gives a different divergence angle because a different modal modulation number m is achieved with each, according to Equation 6. When nothing special is done to fine tune the grating period, the laser may operate on very high m values, giving large divergence angles.

Also, when the laser is over-coupled by deep grating grooves, strong intensity modulation at low m values can cause spatial hole burning, favoring the higher modes for which the modulation amplitude is less. Gratings must therefore be optimized both in terms of period and depth.

To achieve low m values, one might fabricate several lasers with DFB gratings with close periods, allowing direct measurement of beam quality and spectrum for different m. Beam quality may be determined in the far-field using a room-temperature IR camera (as available from Raytheon, Inc. of Waltham, Mass.). The emission spectrum may be measured using a Fourier spectrometer.

Figure 3A:
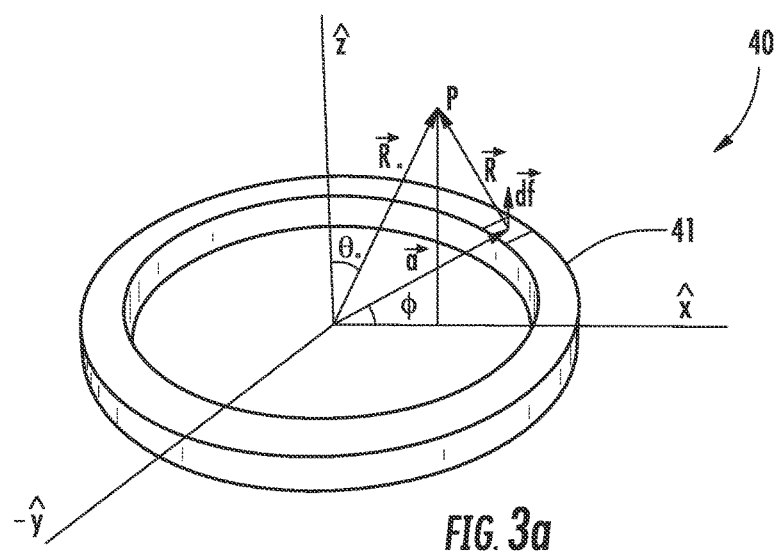
FIG. 3a is a schematic diagram of a perspective view of a RCSE-QCL, according to the prior art.
Figure 3B:
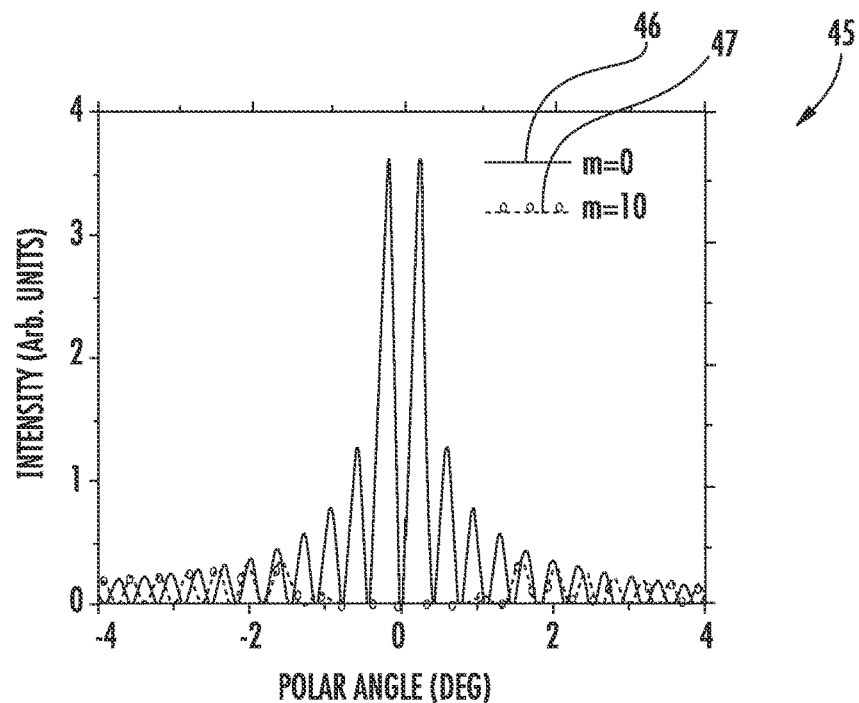

FIG. 3a presents a schematic of a RCSE-QCL 40, where the circulating beam is transverse-magnetic (TM) polarized with a radial magnetic field. In FIG. 3A, the straight lines and lettered arrows define the coordinate system and quantities used in the theoretical analysis of the beam profile. As will be appreciated, the required surface DFB grating and supporting substrate are not shown. Periodic boundary conditions require waves returning to the same point to have the same phase, i.e. it is a standing wave just like in a FP cavity where an integral number of full wavelengths equals the optical length of one round trip. The effect of a DFB grating 41 on top is that the −2 diffracted order is directed opposite the 0-order "incident beam", providing feedback and wavelength selection according to Equation 5. The −1 diffracted order is outcoupled through the surface of the ring. The grating extracts only the portion of the standing wave inside with the same phase at each tooth. All teeth are supposed to emit synchronously with the same phase. If m=0, there is no modal modulation, and Equation 4 requires that $\lambda/n_{eff}=\Lambda$, i.e. the wavelength inside the ring must equal the grating period. Then, the emitted radiation is polarized in the same azimuthal direction with the same phase. Out-coupled waves diverge strongly in the radial direction due to the narrowness of exit aperture of the ridge in the radial direction. The rays from opposite sides of the RCSE-QCL 40 have opposite phase and combine destructively at the axis of symmetry, creating a central node in the far-field. As shown in diagram 45 (curve 46: m=0, curve 47: m=10), the larger order m of the operating mode (i.e. curve 47) causes larger divergence angle of a donut-shaped beam (FIG. 3b).

Figure 4A:
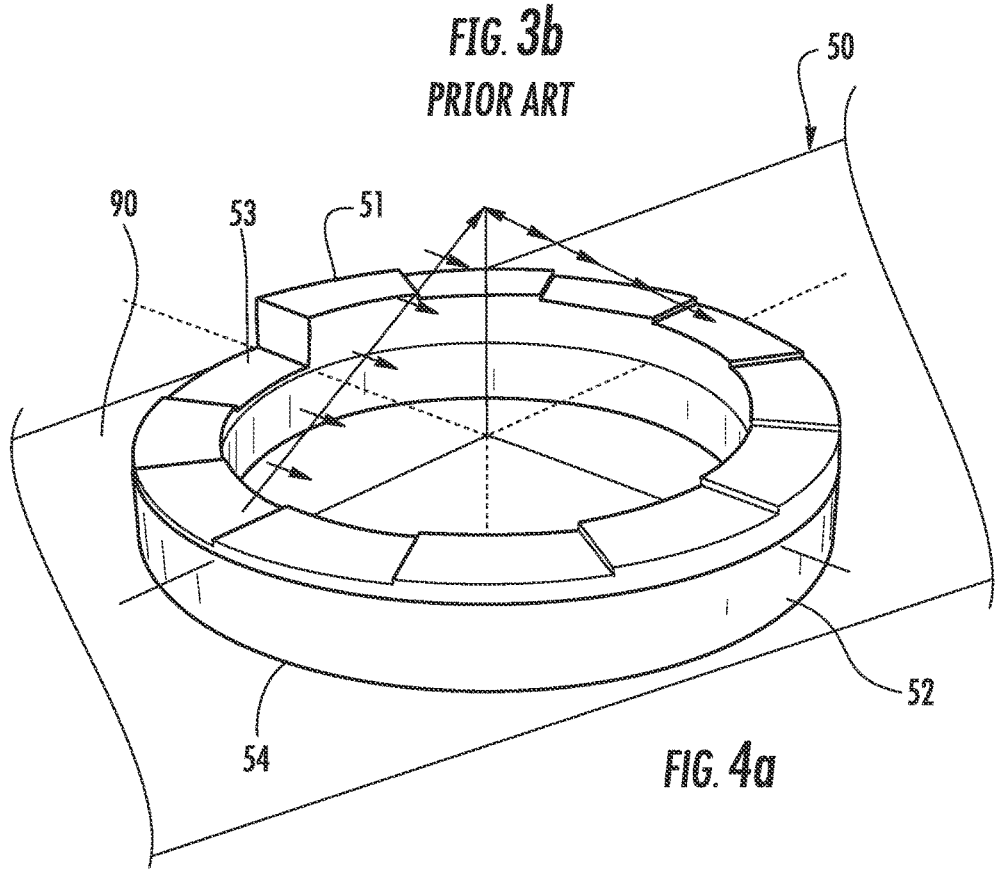
FIG. 4a is a schematic diagram of a perspective view of a ring-shaped active region and ring-shaped phase shifter, according to the present disclosure.

The present embodiments fill the "donut-hole" in the output beam cross-section using a phase corrector in the form of a spiral wedge on the circular exit aperture of the ring-shaped ridge waveguide, as shown schematically in FIG. 4a. The wedge thickness smoothly and continuously increases from zero to an optical depth of one wavelength as it advances completely around the ring. For m=0, the wedge makes all pairs of rays from opposite sides add constructively along the axis of symmetry. However, due to the optical delay introduced by the wedge, rays from positions shifted 90 degrees from those shown in the figure individually have a node at the symmetry axis at the instant shown. Consequently, at the instant shown, the resulting electric field points in a single horizontal direction. At a later instant, due to the advancement of the phase with time, the pair of rays that add have advanced around the ring, so the direction of the resulting field rotates about the symmetry axis, giving circular polarization. Calculated far-field distributions with and without a wedge clearly show that the wedge fills the central hole of the beam profile. Note that the sum of the two patterns has much reduced amplitude variations and a profile that looks much more Gaussian. This gives a clue on how to tailor the beam shape by using a combination of nested rings with and without wedges.

The condition for all the rings to lase at the same wavelength and on lowest order modes m requires accurate design of grating period and rings' relative diameters, then the result is $m = 2\pi a(n_{eff}/\lambda - 1/\Lambda)$. If a fundamental mode operation for all rings is achieved, then the grating period is just $\Lambda = \lambda/n_{eff}$. For m>0, each different ring radius a will require a different grating period, namely $\Lambda = \lambda/n_{eff} - m/2\pi a$.

The position in polar angle $\theta$ of the circular far-field fringes are determined by Equation 6. A goal is to have these positions for one of the RCSE-QCLs fall in the troughs of another, so that a smooth spot with Gaussian envelope is built up as nearly as possible. This task will determine how many rings and of what diameters to produce a radially-smooth nearly Gaussian intensity profile. It is noted that rings of differing diameters produce oscillating far-field patterns of different period, and with wedges, it is possible to shift the phase of the oscillations by π. Thus, the problem of beam shape is equivalent to a Fourier composition, where (within the limits of the achievable ring radii) there is a complete pallet of "Fourier" components to work with. In other words, it is possible to design nearly any far-field pattern needed for a particular application. For instance, there will be an optimum design to achieve a Gaussian beam with beam quality factor M2<1.2.

Figure 5:
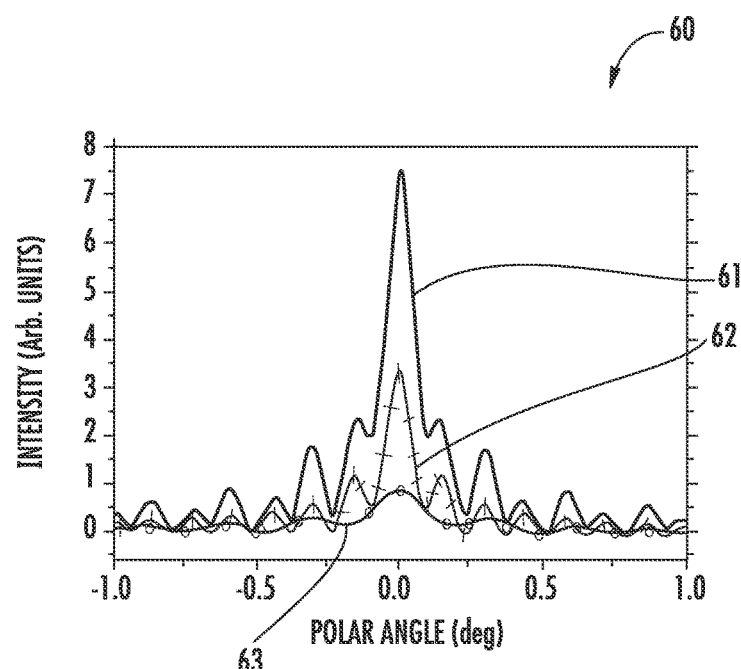
FIG. 5 is a diagram of individual intensities from RCSE-QCLs having ring-shaped phase shifters of 0.5 and 1 mm radii operating on m=0 mode, and their coherent superposition, according to the present disclosure.

Substrate-emitting RCSE-QCL will have feedback due to reflections at the substrate-air interface. These ~30% reflections may suffice to coherently lock phases of emission from all rings. However, to make this locking controllable, coupling ridge bridges between individual rings can be implemented. FIG. 5 includes a diagram 60 that demonstrates the coherent superposition 61 of light from two rings (curve 62 at radius of 1 mm, and curve 63 at a radius of 0.5 mm) and the partial cancellation of the wings due to interference. In principle, employing some rings operating on higher m, and combining rings with and without spiral wedges, will allow to nearly eliminate intensity in the wings to make the beam more nearly Gaussian.

Regarding biasing of nested rings, if each is to have the same gain spectrum, so that each may operate on the same wavelength, it is necessary that each is biased with the same current density. Assuming the resistivity of each ring is the same, this is simply achieved by biasing all rings in parallel with the same power supply.

Each ring may have individual power connection to allow individual characterization of each ring and also allow consequent connection of multiple rings in parallel one by one in order to explore temperature management limits, caused by increased heat dissipation. Special thermoelectrically cooled (TEC) controlled device mount can be designed for high power temperature stabilization.

Figure 11:
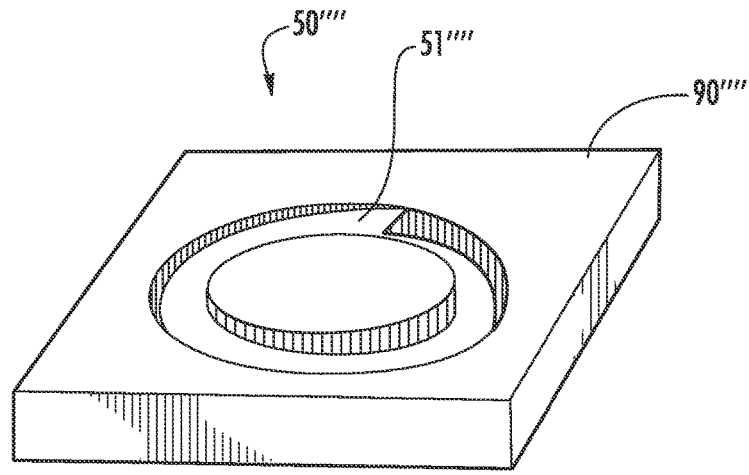
FIG. 11 is a schematic diagram of a perspective view of another embodiment of the ring-shaped phase shifter, according to the present disclosure.

A grey level mask can be used to pattern and etch the vertical spiral wedge in the substrate for substrate-emitting RCSE-QCL. Photoresist is spun onto the substrate and exposed through the grey level mask to produce a gradient of exposure and development rate. Development will result in a wedge of photoresist to serve as an RIE etch mask. The thinner parts of this etch masks will be etched away sooner, exposing the substrate to longer etch times. In this way, a spiral ramp will be etched into the substrate, as shown in FIG. 11.

Figure 10A:
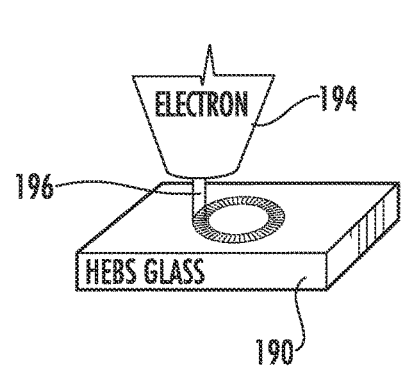
FIGS. 10a and 10b are schematic diagrams of a perspective view of steps for one embodiment of making an embodiment of the ring-shaped phase shifter, according to the present disclosure.
Figure 10B:
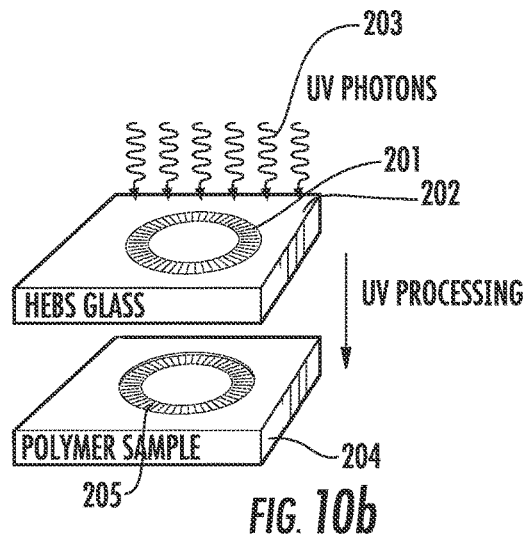

FIGS. 10a-10b shows how grey-level photolithography masks 201 are produced by a standard electron-beam pattern generator 194, which darkens a special glass 190 upon exposure proportionally to electron-beam current 196 and dwell time. The darkness resolution is 500 grey levels with a spatial resolution of 0.1 micron determined by the e-beam focus. For a ring circumference of 0.5 mm, this corresponds to a change in grey level in 1 micron steps. Thus the transitions between grey levels are essentially continuous in comparison to mid-infrared wavelengths. The special glass 190 may be obtained from Canyon Materials, Inc. of San Diego, Calif.

QCL's are currently being used in many spectroscopy applications highlighting an apparent need in the marketplace. The current embodiments will enable similar applications to be highly sensitive while remaining cost effective. The increased power of the laser and improvement in beam quality enabled by the current embodiments allows detectors to be positioned farther from the QCL while maintaining high sensitivity. Additionally a surface emitting device lowers the labor costs of cleaving, mounting, and testing.

The approach has practical applications in the following civilian industries: Manufacturing and Chemical Processing, Medical, Petrochemical Processing and Law Enforcement to name a few.

Potential Applications:
Manufacturing
Highly sensitive chemical sensors may be designed for specific signatures, with applications to safety and quality control.
Security
The proposed approach can be installed as an explosive detection system at an airport, for example. As a sensor of chemical vapors, a QCL-based system may perform the function currently possible only with trained dogs.
Law Enforcement
A QCL-based chemical sensor has application in detection of intoxicants, contraband, drug labs, and human trafficking.
Medical
Device can tuned to detect specific bio markers serving as a non-intrusive test for specific types of cancer, for example. Also, when placed in a surgery room, the proposed approach is highly sensitive to gaseous anesthesia leaks. Medical Device Sales average $110B annually.
Petrochemical Processing
A QCL-based chemical vapor sensor may remotely detect highly flammable or toxic vapors at trace concentrations.

Figure 7:
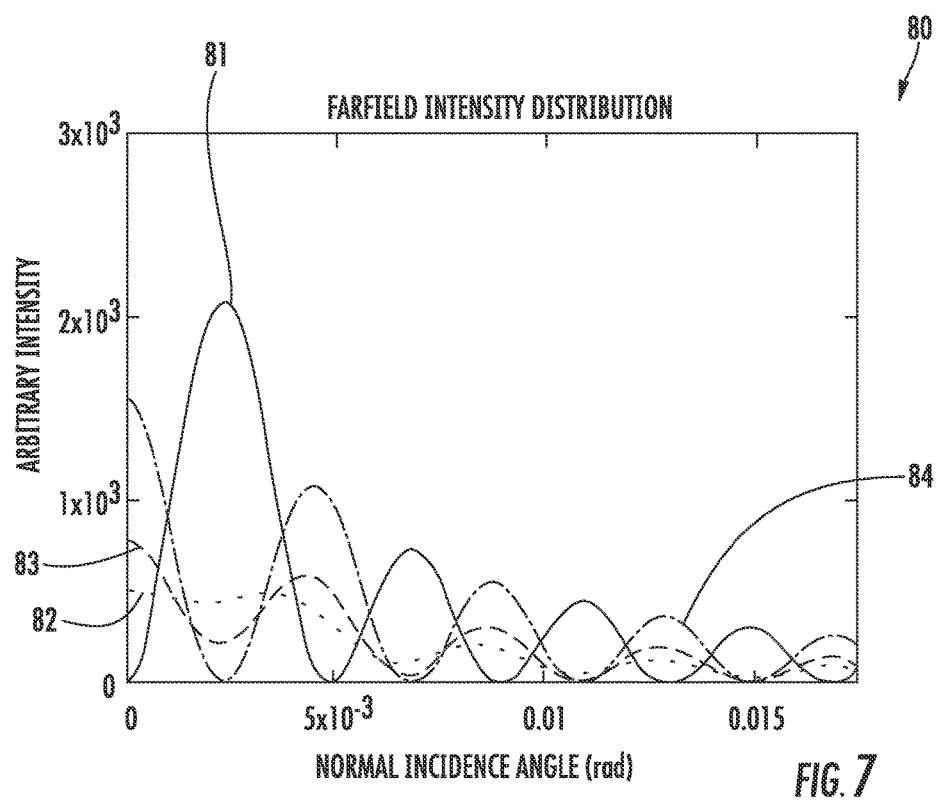
FIG. 7 is a diagram of a far-field intensity distribution for the RCSE-QCL, according to the present disclosure.

Referring now again to FIGS. 4a, 5, and 7, a RCSE-QCL 50 according to the present disclosure is now described. The RCSE-QCL 50 illustratively includes a ring-shaped active region 52 having first and second opposing facets 53, 54. At least one of the first and second opposing facets 53, 54 defines a radiation emitting facet 53. Of course, in some embodiments, both facets 53, 54 may emit radiation. The RCSE-QCL 50 illustratively includes a ring-shaped phase shifter 51 aligned with the radiation emitting facet 53 and having a spiraled surface.

In particular, the ring-shaped phase shifter 51 illustratively has an optical thickness that varies from a first value (e.g. zero or near zero) to a second value greater than the first value based upon a azimuthal position. The second value may comprise an operational wavelength of the ring-shaped active region 52. The ring-shaped phase shifter 51 may reduce a central node in a radiation pattern of the ring-shaped active region.

As shown in diagram 55, the far-field pattern for an exemplary embodiment of the RCSE-QCL 50 is shown for a ring radius of 1 mm. Curve 56 shows the far-field pattern without the ring-shaped phase shifter 51, and curve 57 shows the far-field pattern with the ring-shaped phase shifter 51. Advantageously, the central null in the far-field intensity pattern is eliminated by use of the ring-shaped phase shifter 51.

Also, diagram 80 shows numerical results of the effect of non-integer phase shift on the far-field as a function of angle (curve 81: 0.0π; curve 82: 0.6π; curve 83: 0.7π; and curve 84: 1.0π). The ring-shaped phase shifter 51 targets a specific optical thickness such that there is a π difference for radiation emitted from opposite elements of the ring. If the spiral height deviates from this design, effectively there will be different phase differences. The tolerance of this design to achieve a central lobe is nearly +/−0.4π radians of phase difference.

In the illustrated embodiment, the RCSE-QCL 50 further comprises a substrate 90 adjacent and coplanar with the ring-shaped active region 52 and being opposite the radiation emitting facet 53 of the ring. In this illustrated embodiment, the substrate 90 abuts the non-emitting facet 54, and the ring-shaped phase shifter 51 is illustratively positioned on top of the radiation emitting facet 53, i.e. the free facet, of the ring-shaped active region 52. In other embodiments (FIG. 11), the ring-shaped phase shifter 51 may be positioned spaced apart to the radiation emitting facet 53.

To obtain normal emission to the surface, a grating is formed on the radiation emitting facet 53 of the ring-shaped active region 52, which doubles as a distributed feedback mechanism for wavelength selection. If the grating period is incorrectly matched to the dominant mode's wavelength, then a periodic series of "hot spots" will appear around the ring-shaped active region 52 located by the spatial "beat frequency" between the waveguide mode and grating mode, resulting in an increased integer order (m) of a modal envelope function, which consequently increases the divergence angle. Emission can be modeled as an azimuthal polarized electromagnetic wave diffracting through an aperture of ring radius a.

As shown in diagram 55, the calculated far-field pattern as a function of polar angle is shown. The ring-shaped phase shifter 51 provides the phase shift necessary so that emission from opposite sides of the ring can add constructively, thereby eliminating the usual donut hole in the beam of RCSE-QCLs. The beam still has diffraction rings due to the finite aperture, but in principle, a perfectly smooth Gaussian beam can be achieved using nesting concentric rings with and without wedges, as shown in FIG. 5.

Another aspect is directed to a method of making a RCSE-QCL 50. The method may comprise forming a ring-shaped active region 52 having first and second opposing facets, at least one of the first and second opposing facets defining a radiation emitting facet, and forming a ring-shaped phase shifter 51 aligned with the radiation emitting facet and having a spiraled surface.

Figure 6:
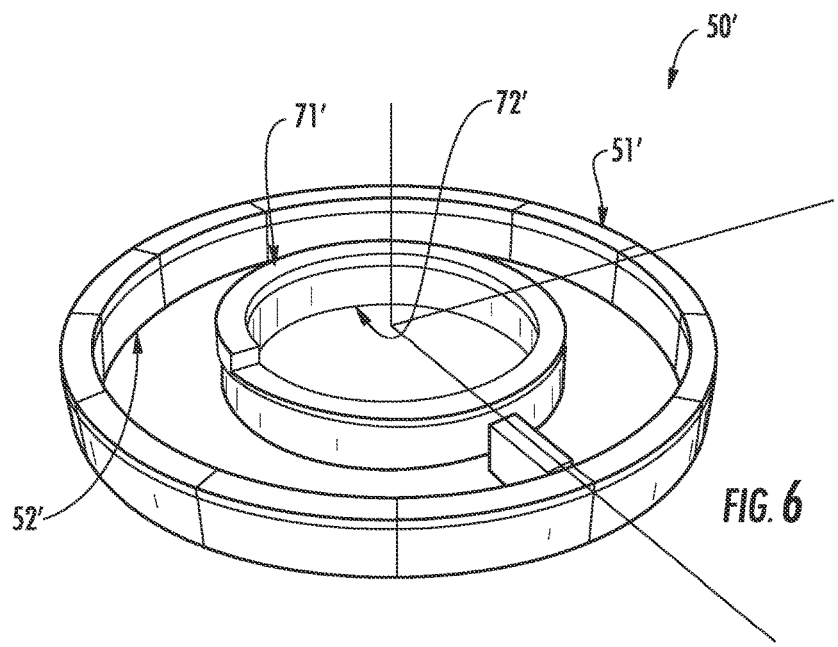
FIG. 6 is a schematic diagram of a perspective view of another embodiment of concentric coupled RCSE-QCLs, each with ring-shaped spiral-wedge phase shifter, according to the present disclosure.

Referring now additionally to FIG. 6, another embodiment of the RCSE-QCL 50' is now described. In this embodiment of the RCSE-QCL 50', those elements already discussed above with respect to FIG. 4a are given prime notation and most require no further discussion herein. This embodiment differs from the previous embodiment in that this RCSE-QCL 50' further comprises an additional ring-shaped active region 72' with a corresponding ring-shaped phase shifter 71' nested with the ring-shaped active region 52'. The additional ring-shaped active region 72' and the ring-shaped active region 52' may emit radiation of a same wavelength. The RCSE-QCL 50' may further comprise a distributed feedback grating adjacent to the additional ring-shaped active region 72' and the ring-shaped active region 52'. The additional ring-shaped active region 72' and the ring-shaped active region 52' may be concentric to produce a radially smooth intensity profile without azimuthal modal modulation.

Figure 8:
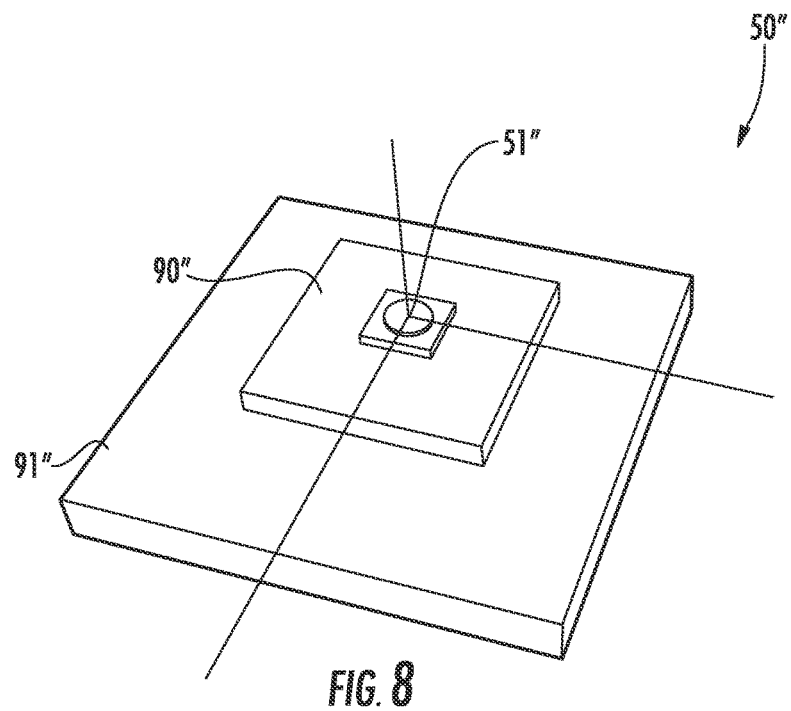
FIG. 8 is a schematic diagram of a perspective view of another embodiment of the ring-shaped active region and ring-shaped phase shifter, according to the present disclosure.

Referring now additionally to FIG. 8, another embodiment of the RCSE-QCL 50" is now described. In this embodiment of the RCSE-QCL 50", those elements already discussed above with respect to FIG. 4a are given double prime notation and most require no further discussion herein. This embodiment differs from the previous embodiment in that this RCSE-QCL 50" illustratively includes a cooling device 91" adjacent the substrate 90".

Figure 9:
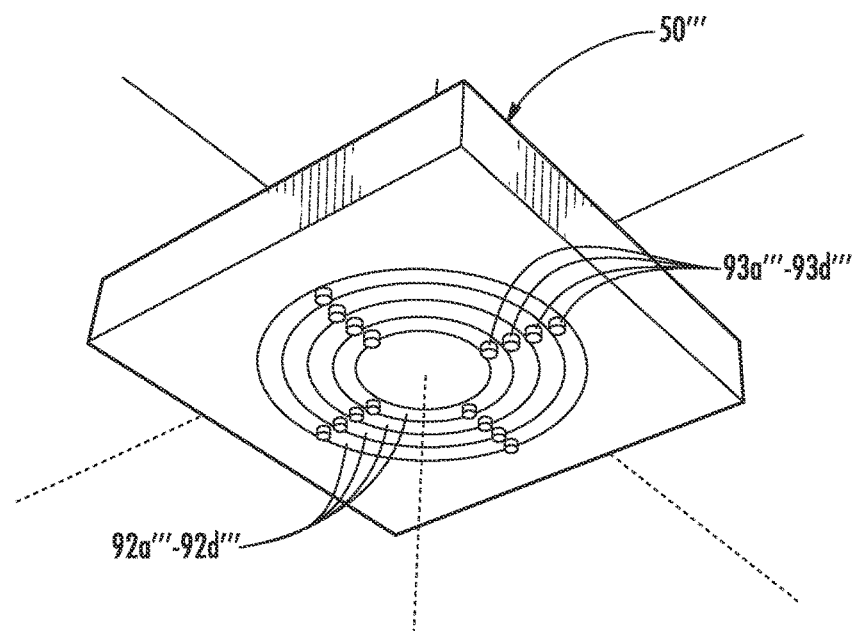
FIG. 9 is a schematic diagram of a perspective view of yet another embodiment of the ring-shaped active region and ring-shaped phase shifter, according to the present disclosure.

Referring now additionally to FIG. 9, another embodiment of the RCSE-QCL 50''' is now described. In this embodiment of the RCSE-QCL 50''', those elements already discussed above with respect to FIG. 4a are given triple prime notation and most require no further discussion herein. This embodiment differs from the previous embodiment in that this RCSE-QCL 50''' comprises four concentric ring-shaped active regions 92a'''-92d''', and a plurality of solder bumps 93a'''-93d''' for flip chip bonding. Although in this embodiment, flip chip packaging is used, other packaging technologies may be used.

Referring now additionally to FIG. 10a, which illustrates one embodiment of creating a spiral phase shifter. The illustrated high energy beam sensitive glass (HEBS) 190 is placed in an electron-beam lithography system 194. It is subjected to doses of electron beam 196 that vary azimuthally in a ring shaped pattern. This varying dose causes an angle dependent darkening of the glass, which serves as a grey mask for photolithography.

Referring now additionally to FIG. 10b, which illustrates the use of a grey scale mask 201, which was formed in HEBS glass 202, to illuminate a photo-sensitive polymer 204 in a ring pattern 205 with azimuthally varying UV 203 dose. The spiral wedge appears in the polymer upon chemical development, which acts at different rates on parts of the ring which have received different UV doses. The polymer ring may be used as the phase shifter, or it maybe used as a sacrificial etch mask to create a spiral in a different material.

Referring now additionally to FIG. 11, which presents a schematic of the underside of a substrate 90"". A ring-shaped spiral phase shifter has been etched into the substrate 90"". A substrate emitting RCSE-QCL has been fabricated on the opposite side of the substrate 90"" and concentric with the spiral phase shifter. The light emitted by the RCSE-QCL passes through the spiral wedge, such that the central node is eliminated from the far-field intensity distribution.

Thus, as shown in FIG. 10a, to fabricate the spiral wedge with this process, the HEBS glass 190 is inserted into an electron beam 196 of a lithography system 194 to be directly written upon. The ring has an electron-beam dose that depends upon azimuth angle in the HEBS glass 190. The HEBS mask with the patterned variably-opaque annulus may then be used for standard photolithography techniques, taking advantage of the dependence of development rate for photopolymers having different ultraviolet (UV) exposure doses (FIG. 10b). By optimizing the UV exposure and photopolymer development rate, a 3D spiral of polymer may be created in photoresist. As will be appreciated, there will be a greater photon flux in different areas, allowing the spiral formation.

Figure 12:
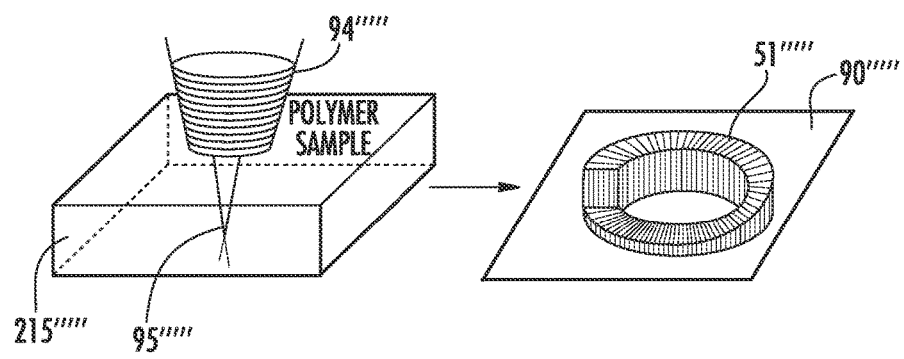
FIG. 12 is a schematic diagram of a perspective view of steps in making another embodiment of the ring-shaped phase shifter, according to the present disclosure.

Referring now additionally to FIG. 12, another embodiment of fabricating a spiral wedge in a photo-sensitive polymer 215''''' is presented. In this method, those elements already discussed above with respect to FIG. 4a are given quintuple prime notation and most require no further discussion herein. In this embodiment, the method for making the ring-shaped phase shifter 51''''' uses a direct laser writer 94''''' (DLW) using a laser beam 95'''''.

In this embodiment, the photoresist spiral wedge itself may remain. In FIG. 12, this wedge is shown resting on the bottom surface of the substrate 90''''' as an example. This spiral wedge may serve as the ring-shaped phase shifter 51''''', if the photoresist optical properties are suitable. Or, the photoresist may serve as a sacrificial etch mask for a different underlying material with better optical properties. In substrate-emitting RCSE-QCLs, the second method may be applied to the substrate itself, as shown in FIG. 11.

Although not shown in this embodiment, the ring-shaped active region 52''''' is on the side of the substrate 90''''' opposite to the side presented in FIGS. 11 and 12. The vertical spiral wedge may also be fabricated using the DLW 94'''''. In FIG. 12, a photo polymer undergoes polymerization at an energy threshold that requires two or more UV photons. The sample moves on a piezoelectric stage with 3 degrees of freedom while the laser focus remains fixed. A similar direct write approach would use an electron-beam lithography system and a dose dependent spin-on polymer electron-beam resist.

In the following, an exemplary discussion of the mathematical basis for the ring-shaped phase shifter 51 is presented. Refer to FIG. 3a, the meaning of geometrical variables is described. Huygens principle gives for any field component $u_p$ at the observation point P $$u_p = \int \frac{kue^{ikR}}{2iR\pi} df_n; \quad (1')$$

where k is the wavevector magnitude. The integral is performed over the emitting surface, i.e. the top surface of the ring. Without loss of generality, given the azimuthal symmetry, the coordinates may be aligned so that the x-axis is directly under the field point P, so that only the polar angle $\Theta_0$ and radius $R_0$ are needed to specify its position. The polar angle for the position of each area element is $\pi/2$, so that only the azimuthal angle $\phi$ and ring radius a are necessary to specify an area element's position.

With these coordinates, the vector from area element to field point R is:

$$R = R_0 - a = \{R_o \sin \Theta_o - a \cos \phi, -a \sin \phi, R_o \cos \Theta_o\}.$$

The area element df is already in the same direction as the assumed direction vector n of the rays from the source of emission within the ring to the exit aperture on the top surface of the ring, so that $df_n = df$.

Since $a \ll R_o$, the following proves true: $R = \sqrt{(R_0^2 + a^2 + 2R_0 a \sin \Theta_0 \cos \phi)} \approx R_0 - a \sin \Theta_o \cos \phi$. The range of $\Theta_o$ is small, so keeping the angle dependent terms in the denominator of Equation 1' gives only small variations with polar angle. Hence, it can be approximated as $R \approx R_0$. On the other hand, the factor ka in the argument of the complex exponential may be large, giving rise to a large phase that oscillates rapidly with changes in polar angle, so the second term in the expansion of R must be kept. Then, Equation 1' becomes $$u_p = \frac{wake^{ikR_o}}{2i\pi R_o} \int_0^{2\pi} ue^{-ika\sin\theta_o \cos\phi} d\phi. \quad (2')$$

The electric field of the emitted wave at the surface of the ring is $E = E_0\{-\sin \phi, \cos \phi, 0\}$, which provides:

$$E_{py} - iE_{px} = \frac{wake^{ikR_o}}{2i\pi R_o} \int_0^{2\pi} e^{-ika\sin\theta_o \cos\phi} e^{i\phi} d\phi. \quad (3')$$

$E_{Px}$ calculates to zero, because each member of each pair of opposite area elements equally distant from P emits $\pi$ out of phase and their contributions cancel. However, opposite area elements that emit out of phase in the y direction are at different distances from P and do not completely cancel. The definition of the Bessel function in integral form is $$J_n(z) = \frac{1}{2i^n \pi} \int_0^{2\pi} e^{iz\cos\phi} e^{in\phi} d\phi, \quad (4')$$

so that $$E_{py} = -\frac{wake^{ikR_o} E_o}{R_o} J_1(ka\sin\theta_o), \quad (5')$$

where the property that $J_1$ is an odd function of its argument has been used.

To eliminate the central node, a spiraling wedge is added to the top of the ring, such that the phase of the emitted light is shifted by $2\pi$ in going once around the ring. A change is introduced into Equation 1' such that there is an additional angle dependence on the phase term in Equation 1', such that it becomes $$u_p = \frac{wake^{ikR_o}}{2i\pi R_o} \int_0^{2\pi} ue^{-ika\sin\theta_o \cos\phi + i\phi} d\phi; \quad (6')$$

then $$E_{py} - iE_{px} = -\frac{wake^{ikR_o} E_o}{iR_o} J_2(ka\sin\theta_o), \text{ and} \quad (7a')$$

$$E_{py} + iE_{px} = -\frac{wake^{ikR_o} E_o}{iR_o} J_0(ka\sin\theta_o), \quad (7b')$$

where the evenness of the functions $J_0$ and $J_2$ with respect to their arguments has been used. Equations 7a' and 7b' give $$E_{py} = \frac{wake^{ikR_o} E_o}{2iR_o} [J_0(ka\sin\theta_o) - J_2(ka\sin\theta_o)], \text{ and} \quad (8a)'$$

$$E_{px} = -\frac{wake^{ikR_o} E_o}{2R_o} [J_0(ka\sin\theta_o) + J_2(ka\sin\theta_o)]. \quad (8b)'$$

Figure 4B:
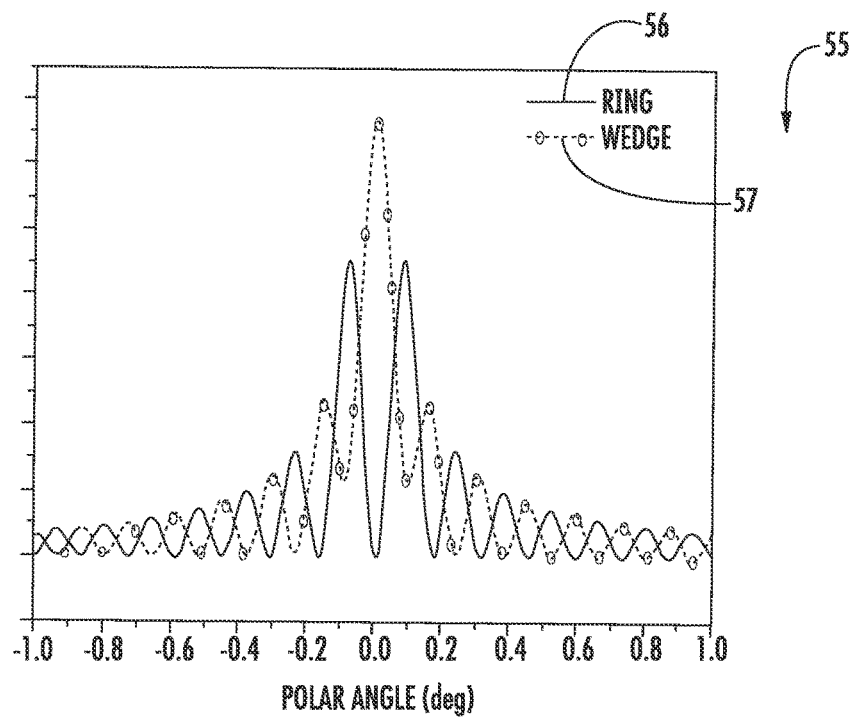

The intensity of the fields presented in Equations 5' and 8' are plotted as a function of angle in FIG. 4b. Results of Equation 8' show a central peak whereas those for Equation 5' have a central node, as already known for standard ring-cavity surface emitting RCSE-QCLs.

The phase shifter targets a specific spiral height, such that there is a $\pi$ phase difference for laser light emitted from opposite surface elements of the ring. If the spiral deviates from this design, effectively there will be a non-integer phase shift in Equation 6'. Numerical results for the far-field intensity distribution for different spiral heights are presented in FIG. 7. The tolerance of this design to achieve a central lobe is nearly +/−0.4 $\pi$ radian.

Possible Methods of Producing Wedge

A wedge of varying optical thickness creates a phase shift for light emitted around the ring. The wedge may be additive or subtractive. A schematic of an additive ring placed on top of a RCSE-QCL is presented in FIG. 4a. Such a spiraling wedge may be fabricated using a gray level mask or by direct writing methods, with the constraint that the ring material need be transparent in the desired wavelength and have comparable etching rates with a sacrificial polymer that will be used for a transfer process via reactive ion etching (RIE) or ion mill etching (IME).

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A ring-cavity surface emitting quantum cascade laser (RCSE-QCL) comprising:
    a ring-shaped active region having first and second opposing facets, at least one of the first and second opposing facets defining a radiation emitting facet; and
    a ring-shaped phase shifter aligned with the radiation emitting facet and having a spiraled surface.

2. The RCSE-QCL of claim 1 further comprising a substrate adjacent said ring-shaped active region and being opposite said radiation emitting facet; and wherein said ring-shaped phase shifter is positioned on the radiation emitting facet of said ring-shaped active region.

3. The RCSE-QCL of claim 1 further comprising a substrate adjacent said ring-shaped active region, abutting said radiation emitting facet, and defining said ring-shaped phase shifter.

4. The RCSE-QCL of claim 1 wherein said ring-shaped phase shifter has an optical thickness that varies from a first value to a second value greater than the first value based upon a azimuthal position.

5. The RCSE-QCL of claim 4 wherein the second value comprises an operational wavelength of said ring-shaped active region.

6. The RCSE-QCL of claim 1 wherein said ring-shaped phase shifter reduces a central node in a radiation pattern of said ring-shaped active region.

7. The RCSE-QCL of claim 1 further comprising at least one additional ring-shaped active region nested with said ring-shaped active region, said at least one additional ring-shaped active region and said ring-shaped active region emitting radiation of a same wavelength.

8. The RCSE-QCL of claim 7 wherein said at least one additional ring-shaped active region and said ring-shaped active region are concentric to produce a radially smooth intensity profile without azimuthal modal modulation.

9. The RCSE-QCL of claim 1 further comprising a cooling device adjacent said ring-shaped active region.

10. A ring-cavity surface emitting quantum cascade laser (RCSE-QCL) comprising:
    a ring-shaped active region having first and second opposing facets, at least one of the first and second opposing facets defining a radiation emitting facet;
    a substrate adjacent said ring-shaped active region and being opposite said radiation emitting facet; and
    a ring-shaped phase shifter aligned with and adjacent the radiation emitting facet, said ring-shaped phase shifter having a spiraled surface;
    said ring-shaped phase shifter having an optical thickness that varies from a first value to a second value greater than the first value based upon a azimuthal position.

11. The RCSE-QCL of claim 10 wherein the second value comprises an operational wavelength of said ring-shaped active region.

12. The RCSE-QCL of claim 10 wherein said ring-shaped phase shifter reduces a central node in a radiation pattern of said ring-shaped active region.

13. The RCSE-QCL of claim 10 further comprising at least one additional ring-shaped active region nested with said ring-shaped active region, said at least one additional ring-shaped active region and said ring-shaped active region emitting radiation of a same wavelength.

14. The RCSE-QCL of claim 13 wherein said at least one additional ring-shaped active region and said ring-shaped active region are concentric to produce a radially smooth intensity profile without azimuthal modal modulation.

15. The RCSE-QCL of claim 10 further comprising a cooling device adjacent said ring-shaped active region.

16. A method of making a ring-cavity surface emitting quantum cascade laser (RCSE-QCL) comprising:
    forming a ring-shaped active region having first and second opposing facets, at least one of the first and second opposing facets defining a radiation emitting facet; and
    forming a ring-shaped phase shifter aligned with the radiation emitting facet and having a spiraled surface.

17. The method of claim 16 further comprising positioning a substrate adjacent the ring-shaped active region and being opposite the radiation emitting facet; and wherein the ring-shaped phase shifter is positioned on the radiation emitting facet of the ring-shaped active region.

18. The method of claim 16 further comprising positioning a substrate adjacent the ring-shaped active region, abutting the radiation emitting facet; and further comprising defining the ring-shaped phase shifter within the substrate.

19. The method of claim 16 wherein the ring-shaped phase shifter has an optical thickness that varies from a first value to a second value greater than the first value based upon an azimuthal position.

20. The method of claim 19 wherein the second value comprises an operational wavelength of the ring-shaped active region.

21. The method of claim 16 wherein the ring-shaped phase shifter reduces a central node in a radiation pattern of the ring-shaped active region.

22. The method of claim 16 further comprising forming at least one additional ring-shaped active region nested with the ring-shaped active region, the at least one additional ring-shaped active region and the ring-shaped active region emitting radiation of a same wavelength.

23. The method of claim 22 wherein the at least one additional ring-shaped active region and the ring-shaped active region are concentric to produce a radially smooth intensity profile without azimuthal modal modulation.

24. The method of claim 16 further comprising coupling a cooling device adjacent the ring-shaped active region.

* * * * *